(12) United States Patent
Teramoto et al.

(10) Patent No.: US 6,521,509 B2
(45) Date of Patent: Feb. 18, 2003

(54) SEMICONDUCTOR DEVICE AND METHOD OF MANUFACTURING THE SAME

(75) Inventors: Akinobu Teramoto, Hyogo (JP); Kousuke Yagi, Hyogo (JP); Hiroshi Umeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/887,322

(22) Filed: Jun. 25, 2001

(65) Prior Publication Data

US 2002/0081818 A1 Jun. 27, 2002

(30) Foreign Application Priority Data

Dec. 21, 2000 (JP) ........................................ 2000-388059

(51) Int. Cl.[7] .......................... H01L 21/76; H01L 21/31; H01L 21/469
(52) U.S. Cl. ........................ 438/424; 438/435; 438/437; 438/787
(58) Field of Search ................................ 438/424, 435, 438/437, 787

(56) References Cited

U.S. PATENT DOCUMENTS

| 5,741,740 A | * | 4/1998 | Jang et al. ................... 438/435 |
| 5,937,308 A | * | 8/1999 | Gardner et al. .............. 438/424 |
| 6,001,707 A | * | 12/1999 | Lin et al. ..................... 438/433 |
| 6,008,095 A | * | 12/1999 | Gardner et al. ............. 438/296 |
| 6,180,492 B1 | * | 1/2001 | Shih et al. ................... 438/435 |

FOREIGN PATENT DOCUMENTS

| JP | 7-273183 | 10/1995 |
| JP | 2000-101071 | 4/2000 |

* cited by examiner

*Primary Examiner*—John F. Niebling
*Assistant Examiner*—Ron Pompey
(74) *Attorney, Agent, or Firm*—McDemott, Will & Emery (57) ABSTRACT

A highly reliable semiconductor device is provided. A silicon nitride film having an opening is formed on a main surface of a silicon substrate. The opening is formed with a side surface. The silicon substrate is etched using the silicon nitride film as a mask to form a trench. The side surface of the silicon nitride film is altered in quality to form a silicon oxide film. A silicon oxide film filling the trench is formed in contact with the silicon oxide film. The silicon nitride film is removed with the silicon oxide film in contact with the silicon oxide film remaining.

11 Claims, 10 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the semiconductor device, and more specifically, to a method of manufacturing a semiconductor device in which adjacent field-effect transistors are isolated by a trench and to a semiconductor device manufactured by this method.

2. Description of the Background Art

In recent years, demand for semiconductor devices is rapidly growing. Accordingly, development in technology for improving the reliability of a semiconductor device is being pursued. Among the semiconductor devices, for those having a plurality of field-effect transistors, a technique is known for forming a trench for isolating adjacent field-effect transistors.

Figure 11:
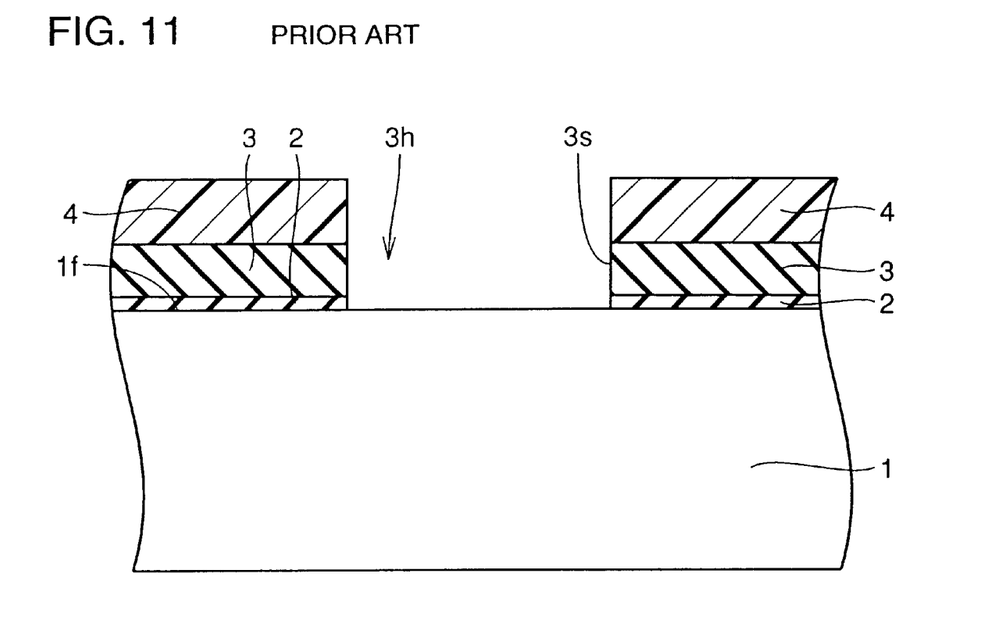
FIGS. 11 to 17 are cross sectional views illustrating first to seventh steps of a method of manufacturing a conventional semiconductor device.
Figure 18:
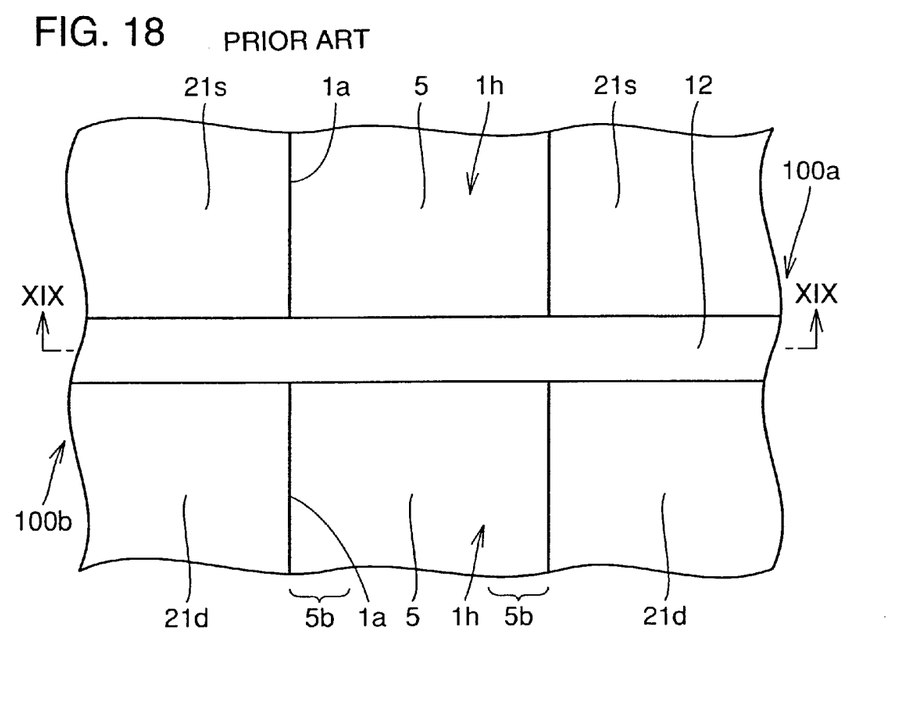
FIG. 18 is a plan view showing the conventional semiconductor device.
Figure 19:
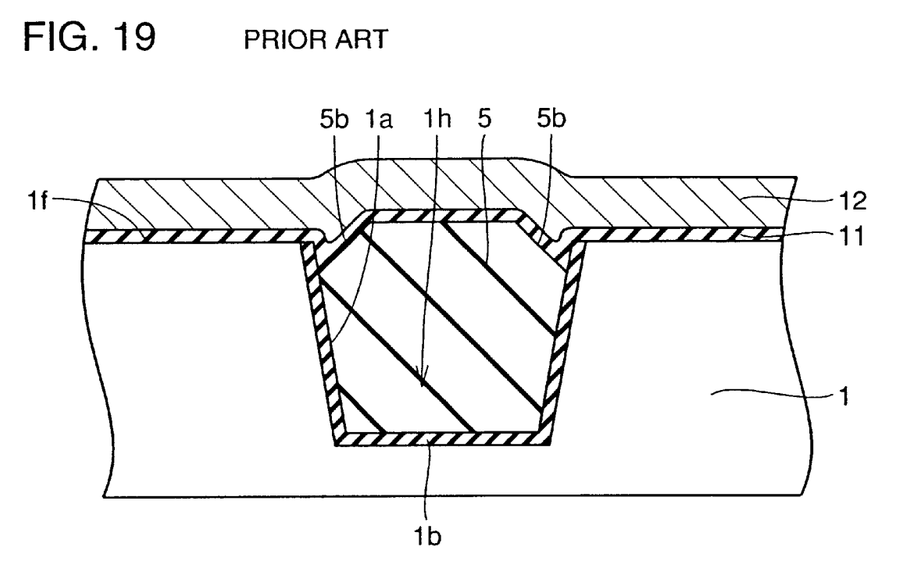
FIG. 19 is a cross sectional view taken along the line XIX—XIX in FIG. 18.

FIGS. 11 to 17 are cross sectional views illustrating a conventional method of manufacturing a semiconductor device. FIG. 18 is a plan view showing a conventional semiconductor device. FIG. 19 is a cross sectional view taken along the line XIX—XIX in FIG. 18. As shown in FIG. 11, a silicon oxide film 2 is formed on a main surface 1f of a silicon substrate 1. A silicon nitride film 3 is formed on silicon oxide film 2. A resist pattern 4 is formed on silicon nitride film 3. Silicon nitride film 3 is etched using resist pattern 4 as a mask to form an opening 3h. Opening 3h is formed with a side surface 3s of silicon nitride film 3. Moreover, silicon oxide film 2 is also removed.

Figure 12:
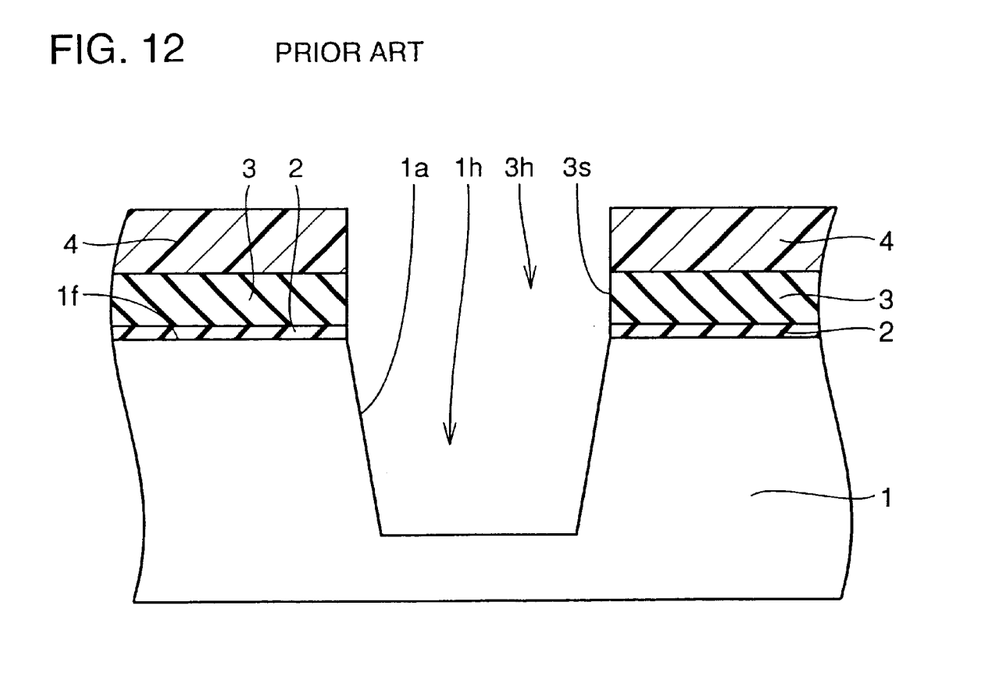

As shown in FIG. 12, silicon substrate 1 is etched using resist pattern 4 and silicon nitride film 3 as a mask. Thus, a trench 1h having a sidewall 1a is formed.

Figure 13:
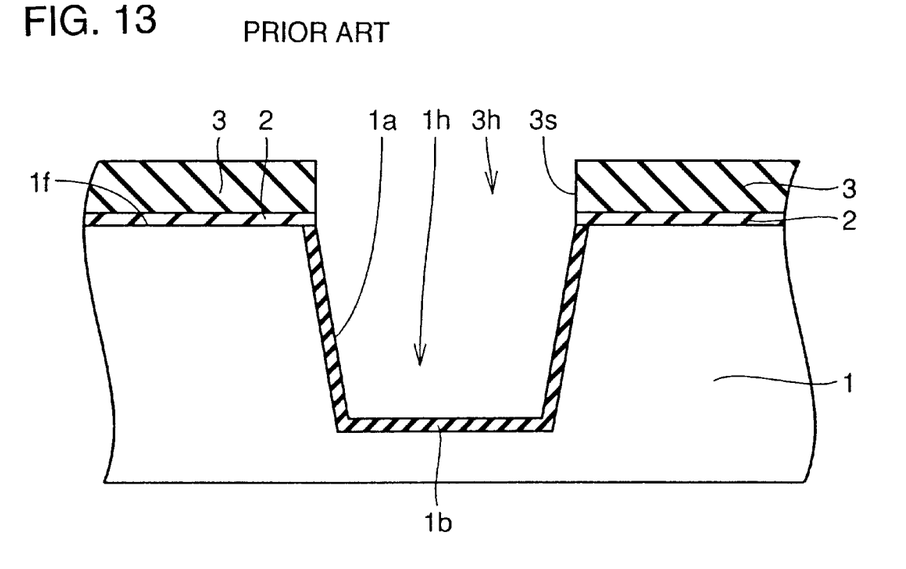

Then, as shown in FIG. 13, sidewall 1a of trench 1h is oxidized with an oxidizing atmosphere of a high temperature to form a silicon oxide film 1b. At this time, a surface of silicon nitride film 3 is not oxidized.

Figure 14:
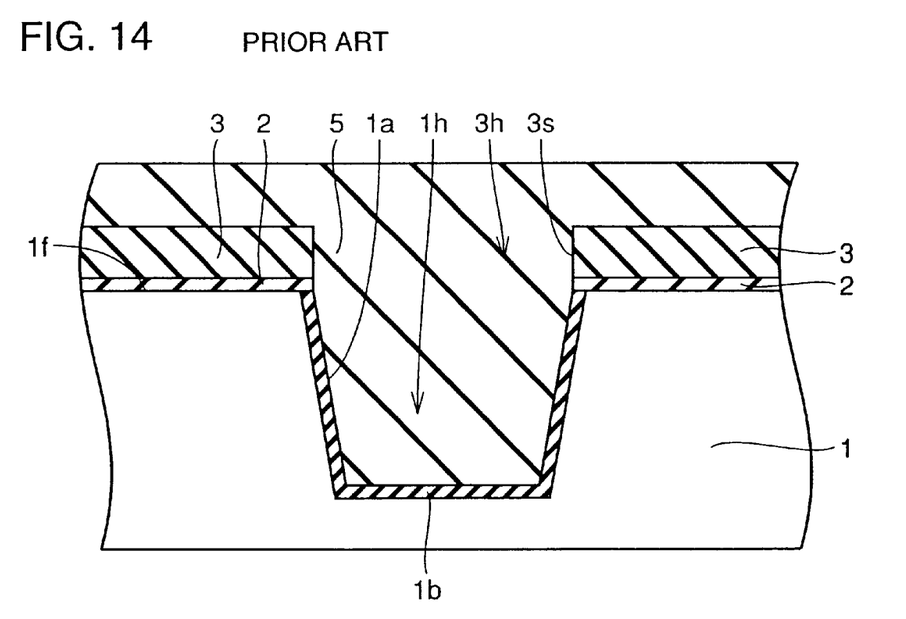

As shown in FIG. 14, a silicon oxide film 5 is formed so as to fill trench 1h and to cover silicon nitride film 3.

Figure 15:
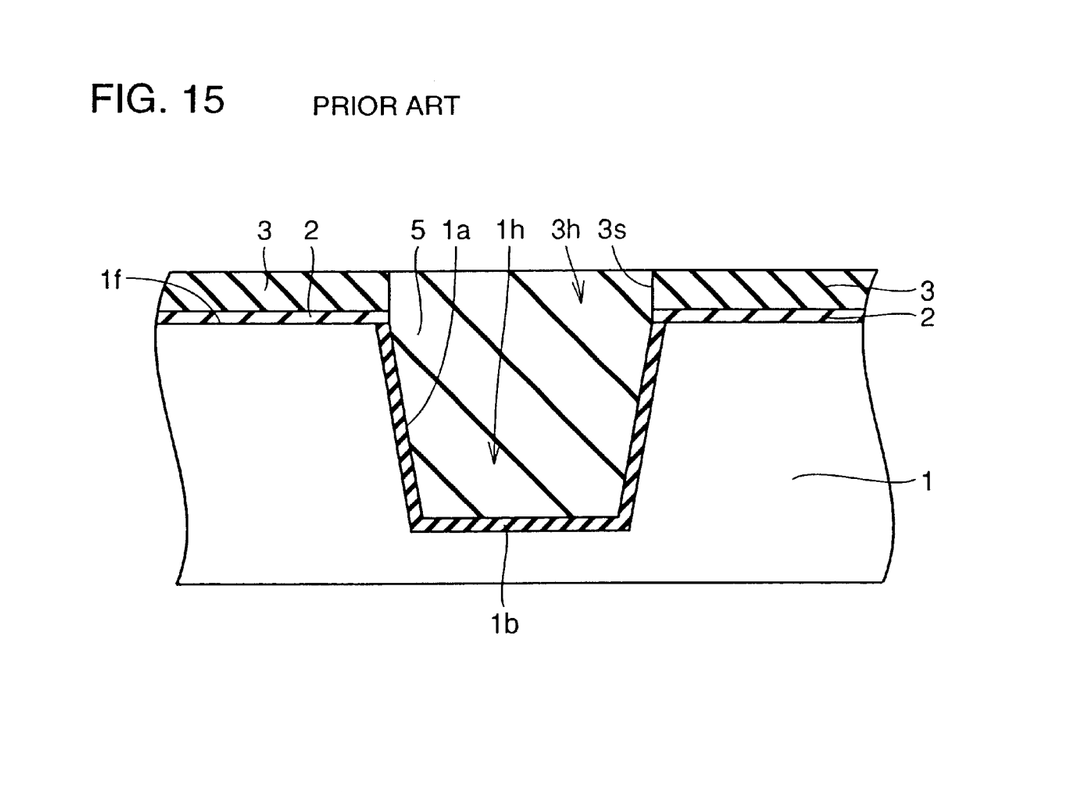

As shown in FIG. 15, a portion of silicon oxide film 5 is removed using CMP (Chemical Mechanical Polishing) method. Consequently, an upper surface of silicon nitride film 3 is exposed.

Figure 16:
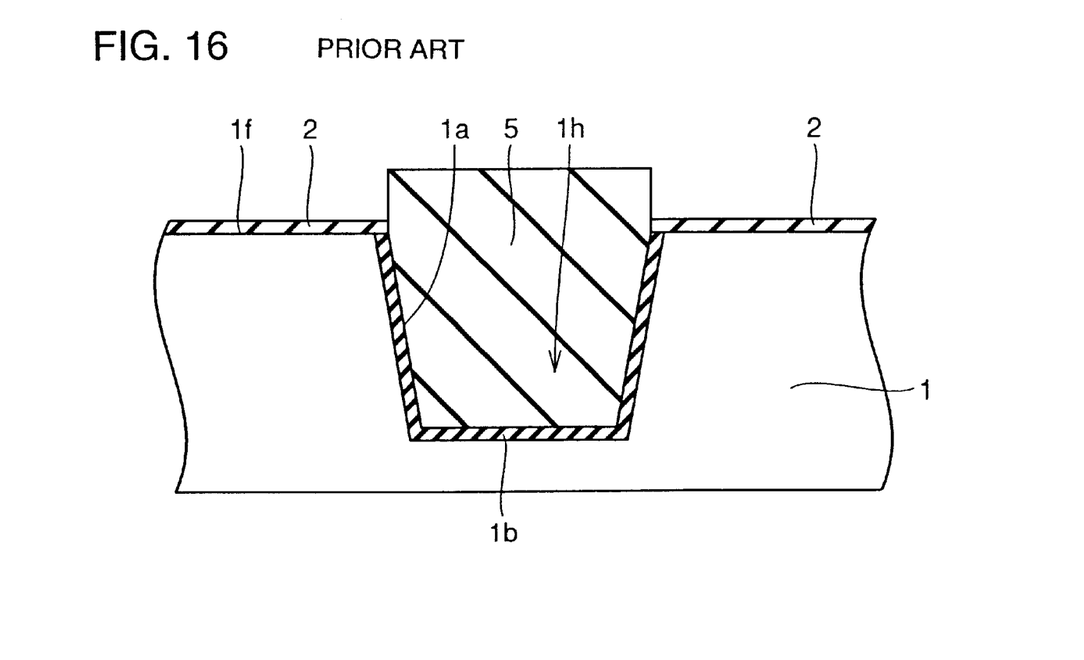

Then, as shown in FIG. 16, silicon nitride film 3 is removed with hot phosphoric acid. As a result, an upper surface of silicon oxide film 2 is exposed.

Figure 17:
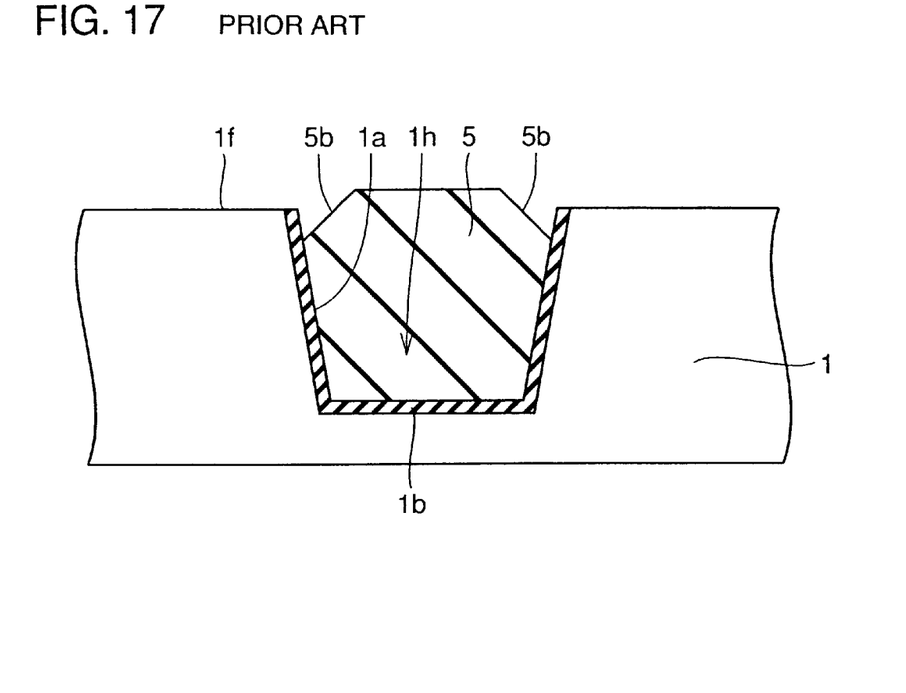

As shown in FIG. 17, silicon oxide film 2 is removed using a hydrofluoric acid solution. At this time, portions of silicon oxide film 5 filling trench 1h in regions close to silicon oxide film 2 are largely etched from the lateral direction. Consequently, lower portions 5b having a surface height that is relatively lower than other portions are formed.

As shown in FIGS. 18 and 19, a gate oxide film 11 is formed on silicon substrate 1. A conductive layer is formed on gate oxide film 11, and is etched to form a gate electrode 12. Impurities are implanted into silicon substrate 1 using gate electrode 12 as a mask to form a source region 21s and a drain region 21d. In this manner, field-effect transistors 100a and 100b are completed. Adjacent field-effect transistors 100a and 100b are isolated from one another by silicon oxide film 5 in trench 1h.

A problem that arises in the conventional method of manufacturing a semiconductor device will be described below.

According to the conventional manufacturing method, lower portion 5b is formed in silicon oxide film 5. Since the surface level of lower portion 5b and other portions differs so that a thickness of gate oxide film 11 in the vicinity of lower portion 5b and a thickness of gate electrode 12 formed thereon become non-uniform, as shown in FIG. 18. As a result, such problem as threshold voltage fluctuation occurs, which leads to degradation in reliability of the semiconductor device.

SUMMARY OF THE INVENTION

The present invention was made to solve the above-described problem, and its object is to provide a highly reliable semiconductor device and a method of manufacturing such a device.

A method of manufacturing a semiconductor device according to the present invention includes a step of forming an underlying layer and a first layer having an opening on a main surface of a semiconductor substrate. The opening is formed by the underlying layer and a side surface of the first layer. The method of manufacturing the semiconductor device further includes a step of forming a groove having a sidewall that is continuously formed with a side surface of a first layer and the underlying layer by etching the semiconductor substrate using the first layer as a mask, a step of altering quality of the side surface of the first layer to form an altered layer in contact with the underlying layer, a step of forming a second layer for filling the groove such that it comes in contact with the altered layer, a step of removing the first layer, with the altered layer in contact with the second layer remaining, and a step of removing the underlying layer with the second layer filling the groove after removal of the first layer.

According to the method of manufacturing a semiconductor device having such a step, the second layer is protected by the underlying layer when the underlying layer is removed so that the second layer is not removed by a large extent. Thus, a portion that is lower than a main surface of the semiconductor substrate is not formed on an upper surface of the second layer. As a result, even when a field-effect transistor is formed on the upper surface of the second layer and on the main surface of the semiconductor substrate, characteristics of the field-effect transistor would not be degraded and reliability of the semiconductor device can be improved.

Moreover, the step of forming an altered layer preferably includes altering quality of a side surface and an upper surface of the first layer to form an altered layer.

In addition, the step of removing the first layer preferably includes removing the first layer by etching such that an etch rate for the first layer is higher than an etch rate for the altered layer and the second layer. In this case, the etch rate for the first layer is relatively high while the etch rate for the altered layer and the second layer is relatively low so that etching of the altered layer and the second layer can be prevented.

Further, the first layer preferably includes a silicon nitride film, while the underlying layer, the altered layer, and the second layer preferably include silicon oxide films.

In addition, the semiconductor substrate is preferably a silicon substrate, and the method of manufacturing a semiconductor device further includes a step of forming an underlying layer made of a silicon oxide film on a main surface of the semiconductor substrate prior to forming the first layer. The step of forming the first layer includes forming the first layer on the underlying layer. In this case, a silicon oxide film exists between a silicon substrate and a silicon nitride film so that characteristics of the semiconductor device would not be degraded.

Moreover, the step of forming the altered layer preferably includes oxidizing a side surface of the first layer.

Further, the step of forming the altered layer preferably includes oxidizing a side surface of the first layer and a sidewall of a groove. In this case, the sidewall of the groove can be oxidized to eliminate a defect on the sidewall of the groove while the altered layer is formed at the same time so that the altered layer can be formed without an additional step.

More preferably, the step of oxidizing the side surface of the first layer includes oxidizing the side surface of the first layer using a dinitrogen oxide gas. In this case, oxidation of the side surface of the first layer formed by a silicon nitride film can be ensured using a dinitrogen oxide gas.

Furthermore, the step of oxidizing the side surface of the first layer preferably includes oxidizing the side surface of the first layer using a mixed gas of oxygen gas and nitrogen oxide gas. In this case, oxidation of the side surface of the first layer formed by a silicon nitride film can be ensured using the mixed gas.

In addition, the step of oxidizing the side surface of the first layer preferably includes oxidizing the side surface of the first layer using a mixed gas of oxygen gas and hydrogen gas. In this case, oxidation of the side surface of the first layer formed by a silicon nitride film can be ensured using the mixed gas.

Moreover, the step of forming the second layer includes forming the second layer that fills a groove and covers the first layer. The method of manufacturing the semiconductor device further includes a step of removing the second layer covering the first layer prior to removal of the first layer.

The semiconductor device according to the present invention is manufactured using any one of the above-described methods. In such semiconductor device, a portion in which an upper surface of the second layer is lower than a main surface of the semiconductor substrate is not formed so that high reliability of the semiconductor device can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described below with reference to the drawings.

First Embodiment

Figure 1:
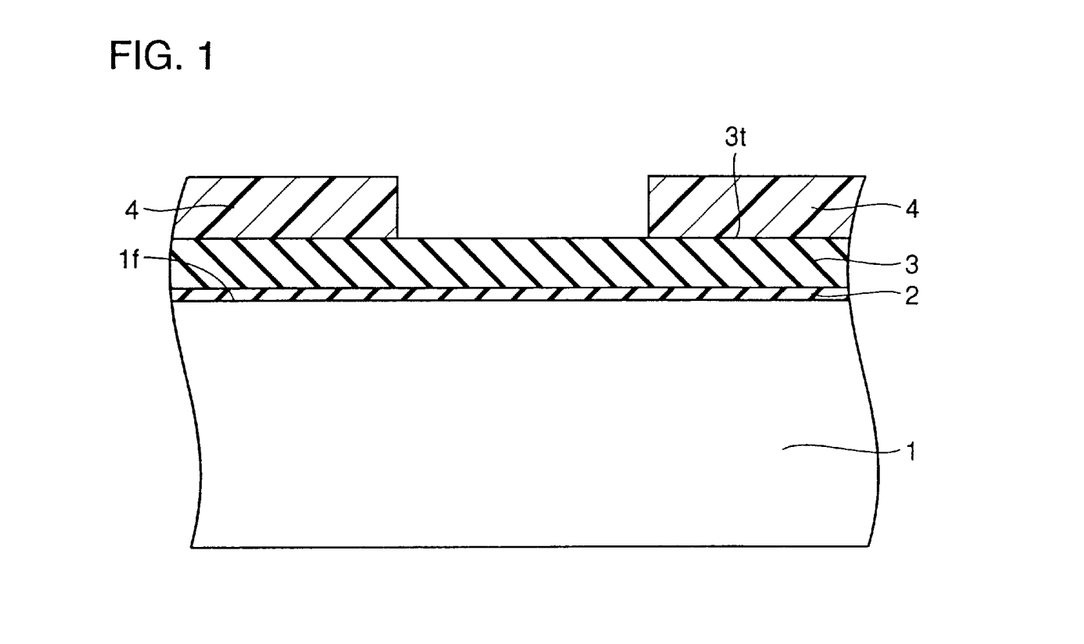
FIGS. 1 to 8 are cross sectional views illustrating first to eighth steps of a method of manufacturing a semiconductor device according to the present invention.

As shown in FIG. 1, a silicon oxide film 2 as an underlying layer is formed on a main surface if of a silicon substrate 1 by thermal oxidation. A silicon nitride film 3 as a first layer is formed on silicon oxide film 2 by CVD (Chemical Vapor Deposition). A resist is applied on silicon nitride film 3, and the resist is patterned by photolithography to form a resist pattern 4.

Figure 2:
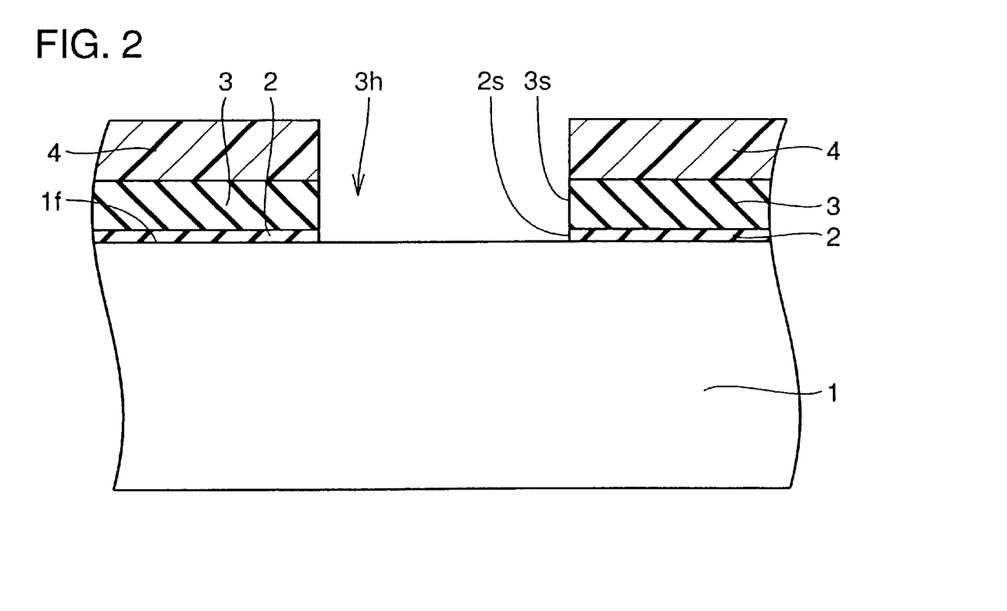

As shown in FIG. 2, silicon nitride film 3 is etched using resist pattern 4 as a mask. Thus, an opening $3h$ is formed in silicon nitride film 3. Opening $3h$ is formed from a side surface $3s$ of silicon nitride film 3 and a side surface $2s$ of silicon oxide film 2. Moreover, silicon oxide film 2 is removed and main surface $1f$ is exposed.

Figure 3:
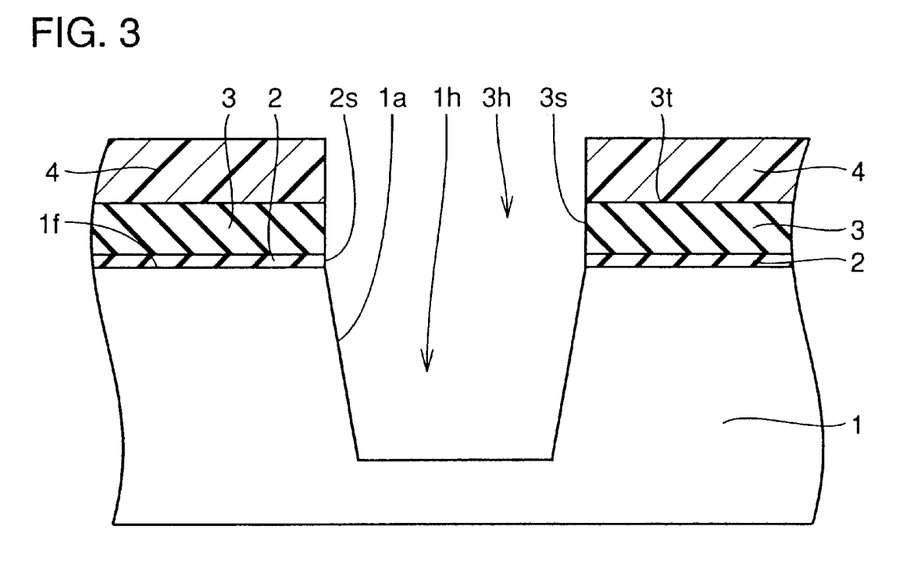

As shown in FIG. 3, silicon substrate 1 is etched using resist pattern 4 and silicon nitride film 3 as a mask. Thus, a trench $1h$ having a sidewall $1a$ as a groove is formed. Trench $1h$ is depressed and extends in a direction vertical to the sheet. Trench $1h$ is formed such that side surfaces $2s$ and $3s$ and sidewall $1a$ are continuous. Thereafter, resist pattern 4 is removed.

Figure 4:
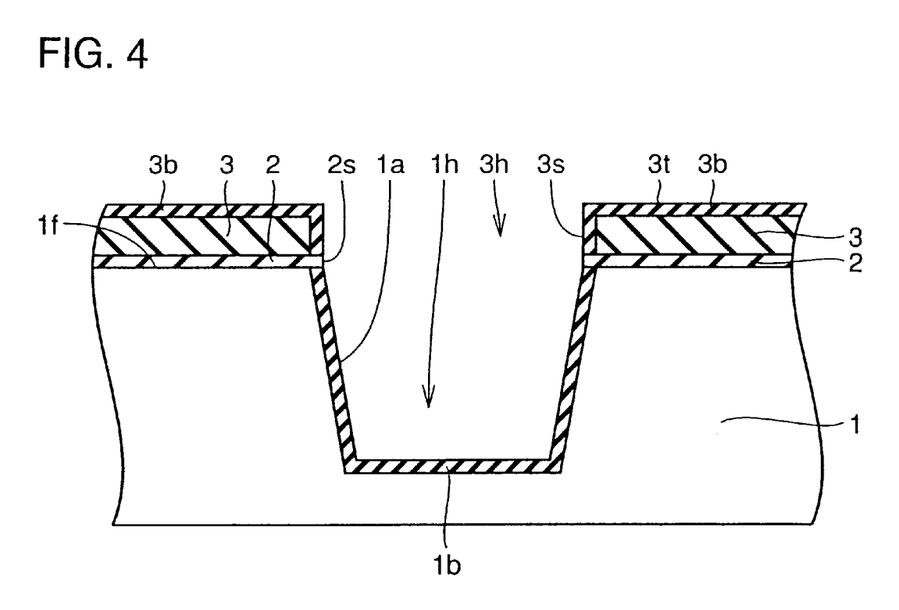

As shown in FIG. 4, sidewall $1a$ of trench $1h$ is oxidized using a mixed gas of oxygen gas and hydrogen gas. At the same time, side surface $3s$ and an upper surface $3t$ of silicon nitride film 3 are oxidized. Thus, a silicon oxide film $1b$ is formed on sidewall $1a$ of trench $1h$. Consequently, a defect produced in sidewall $1a$ is eliminated. At the same time, side surface $3s$ and upper surface $3t$ of silicon nitride film 3 are oxidized and a silicon oxide film $3b$ as an altered layer is formed.

Figure 5:
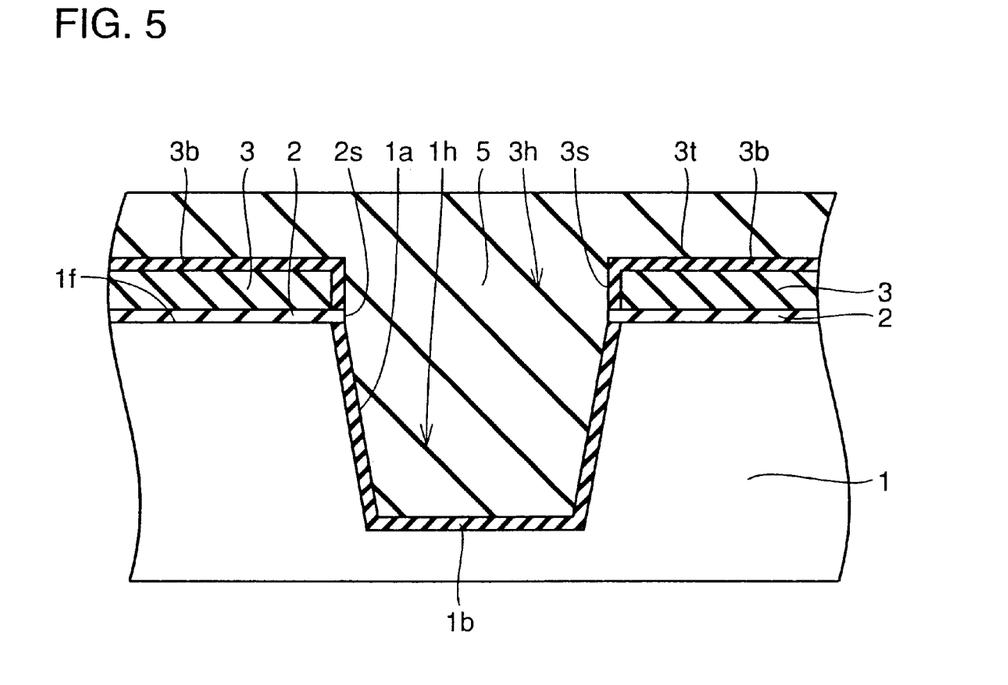

As shown in FIG. 5, a silicon oxide film 5 is formed by CVD such that trench $1h$ is filled and silicon oxide film $3b$ is covered.

Figure 6:
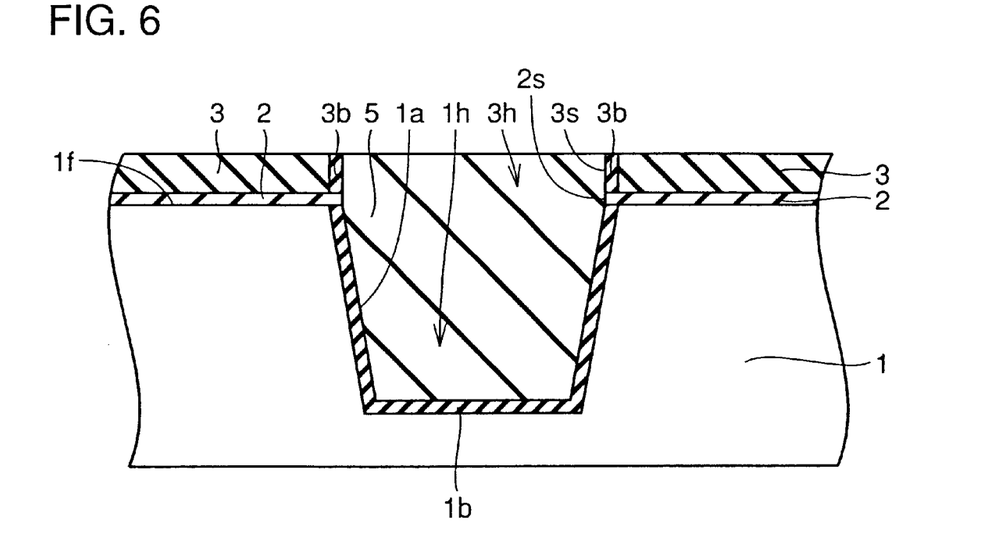

As shown in FIG. 6, a portion of silicon oxide film 5 and silicon oxide film $3b$ formed on upper surface $3t$ of silicon nitride film 3 are removed. Thus, upper surface $3t$ of silicon nitride film 3 is exposed. Silicon oxide film $3b$ formed in contact with silicon oxide film 5 on side surface $3s$ of silicon nitride film 3 remains.

Figure 7:
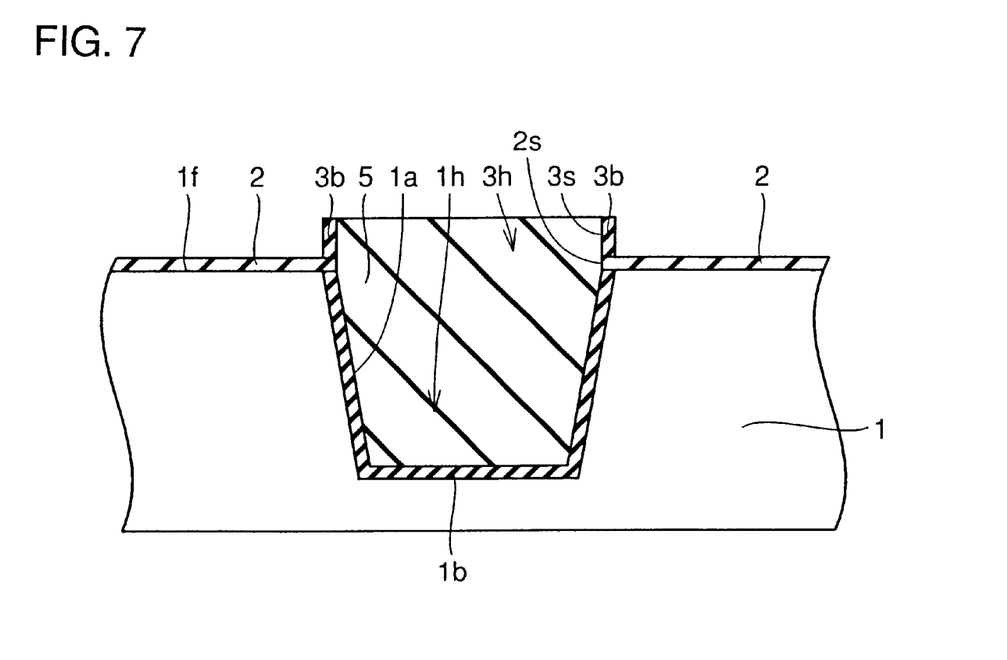

As shown in FIG. 7, silicon nitride film 3 is removed using hot phosphoric acid. At this time, an etch rate of silicon nitride film 3 is relatively high, while an etch rate of silicon oxide film $3b$ and silicon oxide film 5 is relatively low. Consequently, an upper surface of silicon oxide film 2 is exposed.

Figure 8:
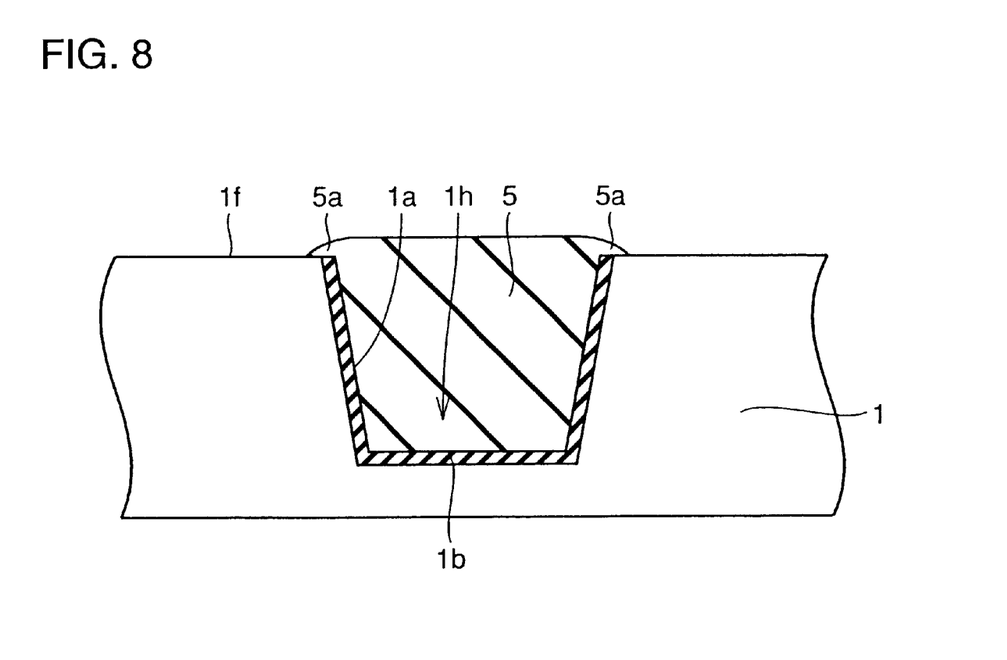
Figure 9:
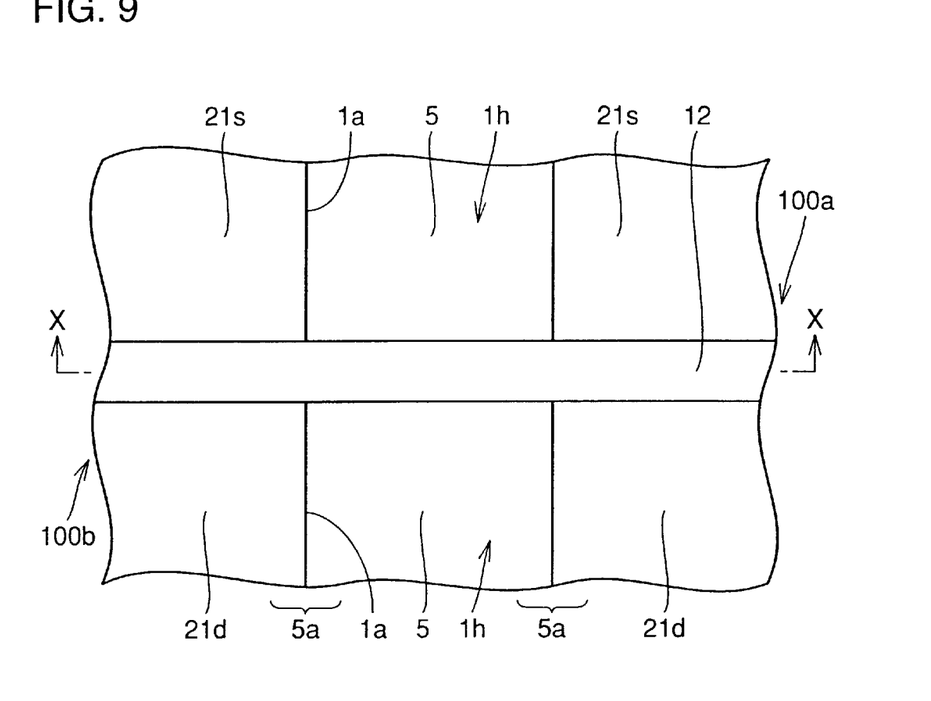
FIG. 9 is a plan view representing a semiconductor device according to the present invention.
Figure 10:
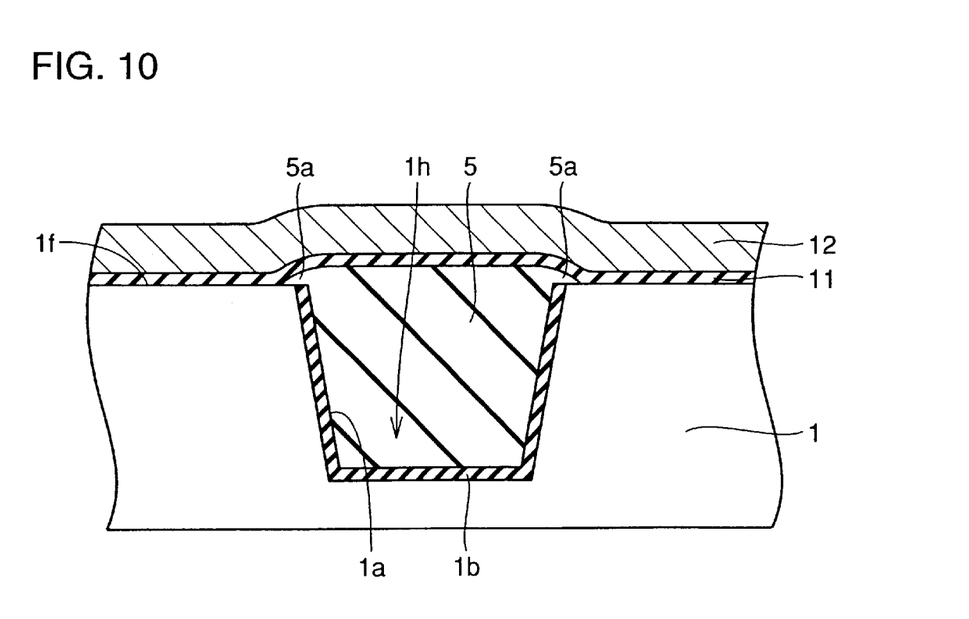
FIG. 10 is a cross sectional view taken along the line X—X in FIG. 9.

As shown in FIG. 8, silicon oxide film 2 is removed using hydrofluoric acid solution. At this time, a portion of silicon oxide film 5 filling trench $1h$ and a portion of silicon oxide film $3b$ in contact with silicon oxide film 5 are removed as well. Consequently, a shoulder portion $5a$ that is formed of a silicon oxide film remains as a portion that runs over from trench $1h$. Shoulder portion $5a$ is formed such that it extends over main surface $1f$ As shown in FIGS. 9 and 10, a gate oxide film 11 is formed on silicon substrate 1. A conductive layer formed of doped polysilicon is formed on gate oxide film 11. This conductive layer is etched into a prescribed shape to form gate electrode 12 that extends in one direction. Impurities are implanted into silicon substrate 1 using gate electrode 12 as a mask to form a source region $21s$ and a drain region $21d$ on either side of gate electrode 12. Thus, field-effect transistors $100a$ and $100b$ are completed. Adjacent field-effect transistors $100a$ and $100b$ are isolated from one another by silicon oxide film 5 filling trench $1h$. Shoulder portion $5a$ is formed such that it runs over from trench $1h$.

According to such method of manufacturing a semiconductor device, in the step shown in FIG. 7, silicon oxide film 5 filling trench 1h as well as silicon oxide film 3b in contact with silicon oxide film 5 is left behind. Consequently, as shown in FIG. 8, silicon oxide film 5 is never excessively etched even when silicon oxide film 2 is etched in a succeeding step. As a result, a relatively low portion is not formed in silicon oxide film 5, and the film thickness of gate electrode 12 never becomes non-uniform when gate oxide film 11 and gate electrode 12 are formed on silicon oxide film 5 in the step shown in FIGS. 9 and 10 so that field-effect transistors 100a and 100b are not adversely affected.

Furthermore, side surface 3s and upper surface 3t of silicon nitride film 3 are oxidized at the same time as sidewall 1a of trench 1h so that no additional step is required for oxidation of the silicon nitride film. Consequently, a highly reliable semiconductor device can be manufactured using the same number of steps as in the conventional example.

Second Embodiment

Oxidation of sidewall 1a of trench 1h and oxidation of side surface 3s and upper surface 3t of silicon nitride film 3 of the step shown in FIG. 4 of the first embodiment is performed by RTP (Rapid Thermal Process) in the second embodiment. As a result, oxidation can be performed in a more active atmosphere.

Third Embodiment

Oxidation of sidewall 1a of trench 1h and oxidation of side surface 3s and upper surface 3t of silicon nitride film 3 of the step shown in FIG. 4 of the first embodiment is performed using dinitrogen oxide gas ($N_2O$) in the third embodiment. As a result, the same effects as those obtained by the first embodiment can be achieved. Moreover, since nitrogen is introduced into silicon oxide film 3b in the oxidation step, oxidation within trench 1h in a succeeding step is suppressed, and thus generation of stress can be suppressed.

Fourth Embodiment

Oxidation of sidewall 1a of trench 1h and oxidation of side surface 3s and upper surface 3t of silicon nitride film 3 of the step shown in FIG. 4 of the third embodiment is performed by RTP in the fourth embodiment. As a result, oxidation can be performed in a more active atmosphere.

Fifth Embodiment

Oxidation of sidewall 1a of trench 1h and oxidation of side surface 3s and upper surface 3t of silicon nitride film 3 of the step shown in FIG. 4 of the first embodiment is performed using oxygen and nitrogen oxide (NO) in the fifth embodiment. As a result, the same effects as those obtained by the third embodiment can be achieved. Moreover, nitrogen can be more effectively introduced.

Sixth Embodiment

Oxidation of sidewall 1a of trench 1h and oxidation of side surface 3s and upper surface 3t of silicon nitride film 3 of the step shown in FIG. 4 of the fifth embodiment is performed by RTP in the sixth embodiment. As a result, oxidation can be performed in a more active atmosphere.

Seventh Embodiment

Oxidation of sidewall 1a of trench 1h and of side surface 3s and upper surface 3t of silicon nitride film 3 of the step shown in FIG. 4 of the first embodiment is performed using plasma that contains active oxygen in the seventh embodiment.

According to the present invention, a highly reliable semiconductor device can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the step of:

forming an underlying layer and a first layer which includes a silicon nitrate film, having an opening on a main surface of a semiconductor substrate, wherein said opening is formed by said underlying layer and a side surface of said first layer, said method further comprising the steps of:

forming a groove having a sidewall that is continuously formed with a side surface of said first layer and said underlying layer by etching said semiconductor substrate using said first layer as a mask;

oxidizing the side surface of said first layer to form an oxidized layer in contact with said underlying layer;

forming a second layer for filling said groove such that it comes in contact with said oxidized layer;

removing said first layer, with the oxidized layer in contact with said second layer remaining; and removing said underlying layer with said second layer filling said groove after removal of said first layer leaving a shoulder portion of the second layer extending from said groove over the main surface of the semiconductor substrate.

2. The method of manufacturing a semiconductor device according to claim 1, wherein the step of forming said oxidized layer includes oxidizing a side surface and an upper surface of said first layer.

3. The method of manufacturing a semiconductor device according to claim 1, wherein the step of removing said first layer includes removing said first layer by etching such that an etch rate for said first layer is higher than an etch rate for said oxidized layer and said second layer.

4. The method of manufacturing a semiconductor device according to claim 1, wherein said first layer includes a silicon nitride film, includes a silicon nitride film, and said underlying layer, said oxidized layer, and said second layer include silicon oxide films.

5. The method of manufacturing a semiconductor device according to claim 4, wherein said semiconductor substrate is a silicon substrate, said method of manufacturing a semiconductor device further comprising the step of:

forming an underlying layer made of a silicon oxide film on a main surface of said semiconductor substrate prior to forming said first layer, wherein the step of forming said first layer includes forming said first layer on said underlying layer.

6. The method of manufacturing a semiconductor device according to claim 1, wherein the step of forming said oxidized layer includes oxidizing a side surface of said first layer and a sidewall of said groove.

7. The method of manufacturing a semiconductor device according to claim 6, wherein
the step of oxidizing the side surface of said first layer includes oxidizing the side surface of said first layer using dinitrogen oxide gas.

8. The method of manufacturing a semiconductor device according to claim 6, wherein
the step of oxidizing the side surface of said first layer includes oxidizing the side surface of said first layer using a mixed gas of oxygen gas and nitrogen oxide gas.

9. The method of manufacturing a semiconductor device according to claim 6, wherein
the step of oxidizing the side surface of said first layer includes oxidizing the side surface of said first layer using a mixed gas of oxygen gas and hydrogen gas.

10. The method of manufacturing a semiconductor device according to claim 1, wherein
the step of forming said second layer includes forming said second layer that fills said groove and covers said first layer, said method further comprising the step of:
removing said second layer covering said first layer prior to removal of said first layer.

11. A semiconductor device manufactured by the method according to claim 1.

* * * * *

UNITED STATES PATENT AND TRADEMARK OFFICE
CERTIFICATE OF CORRECTION

PATENT NO. : 6,521,509 B2  Page 1 of 1
DATED : February 18, 2003
INVENTOR(S) : Akinobu Teramoto et al.

It is certified that error appears in the above-identified patent and that said Letters Patent is hereby corrected as shown below:

<u>Column 6,</u>
Lines 47 thru 52, delete claim 4 so claim 4 reads:
4. The method of manufacturing a semiconductor device according to claim 1, wherein said underlying layer, said oxidized layer, and said second layer include silicon oxide films.

Signed and Sealed this

Twenty-sixth Day of August, 2003

JAMES E. ROGAN
*Director of the United States Patent and Trademark Office*